United States Patent [19]

Rezvani

[11] Patent Number: 5,801,541

[45] Date of Patent: Sep. 1, 1998

[54] STACKED TEST BOARD APPARATUS WITH MATCHED IMPEDANCE FOR USE IN ELECTRONIC DEVICE TEST EQUIPMENT

[75] Inventor: Saiid Rezvani, Los Gatos, Calif.

[73] Assignee: Altera Corporation, San Jose, Calif.

[21] Appl. No.: 743,463

[22] Filed: Oct. 31, 1996

Related U.S. Application Data

[60] Provisional application No. 60/027,447, Sep. 27, 1996.
[51] Int. Cl.$^6$ ............................................. G01R 31/02
[52] U.S. Cl. ............................................. 324/754; 324/158.1
[58] Field of Search .......................... 324/754, 756, 324/757, 761, 762, 765, 158.1, 126

[56] References Cited

U.S. PATENT DOCUMENTS

| | | | |
|---|---|---|---|
| 4,574,236 | 3/1986 | Hechtman | 324/158.1 |
| 4,724,383 | 2/1988 | Hart | 324/754 |
| 4,935,696 | 6/1990 | DiPerna | 324/761 |

*Primary Examiner*—Ernest F. Karlsen
*Assistant Examiner*—Anh Phung
*Attorney, Agent, or Firm*—Flehr Hohbach Test Albritton & Herbert LLP; William S. Galliani

[57] ABSTRACT

An apparatus for use with electronic device test equipment includes a mother test board with a top surface with a first set of pins extending from it, and a bottom surface for connection to a set of pin electronic cards of electronic device test equipment. The apparatus also includes a daughter test board with a top surface with a connection mechanism to receive an electronic device, and a bottom surface with a second set of pins extending from it. An impedance matching structure is positioned between the mother test board and the daughter test board, the impedance matching structure defines a plurality of apertures positionally aligned with the first set of pins and the second set of pins such that the first set of pins and the second set of pins physically mate within the apertures. The first set of pins, the second set of pins, and the apertures are configured to establish a predetermined constant impedance connection between the mother test board and the daughter test board.

11 Claims, 5 Drawing Sheets

STACKED TEST BOARD APPARATUS WITH MATCHED IMPEDANCE FOR USE IN ELECTRONIC DEVICE TEST EQUIPMENT

This application claims priority to the provisional application entitled "Stacked Test Board Apparatus with Matched Impedance for Use in Electronic Device Test Equipment", Ser. No. 60/027,447, filed Sep. 27, 1996.

BRIEF DESCRIPTION OF THE INVENTION

This invention relates generally to electronic device test equipment. More particularly, this invention relates to a versatile stacked test board apparatus with matched impedance that is used to hold electronic devices that are tested by the electronic test equipment.

BACKGROUND OF THE INVENTION

FIG. 1 illustrates electronic test equipment 20 of the type known in the art. In particular, the figure illustrates a mother test board 22 with an electronic device 24 positioned on it. Pins 26 electrically connect the mother test board 22 to an electronic test card 28. The electronic test card 28 is electrically connected to additional electronic test equipment, which is not shown. The mother test board 22 is a relatively complex device because it includes connections to interact with the electronic test cards, in addition to connections for interacting with the electronic device 24.

The problem with the electronic test equipment 20 of the prior art is that mother test boards 22 are typically configured for testing a single electronic device 24. It would be desirable to test multiple electronic devices at the same time. It is relatively expensive to re-design mother test boards. Thus, it would be cost-effective to design a single mother test board that could be used with different daughter test boards, where each daughter test board is configured for testing a different number of electronic devices. Such a configuration would have to provide a predetermined constant impedance between the test boards.

SUMMARY OF THE INVENTION

An apparatus for use with electronic device test equipment includes a mother test board with a top surface with a first set of pins extending from it, and a bottom surface for connection to a set of pin electronic cards of electronic device test equipment. The apparatus also includes a daughter test board with a top surface with a connection mechanism to receive an electronic device, and a bottom surface with a second set of pins extending from it. An impedance matching structure is positioned between the mother test board and the daughter test board, the impedance matching structure defines a plurality of apertures positionally aligned with the first set of pins and the second set of pins such that the first set of pins and the second set of pins physically mate within the apertures. The first set of pins, the second set of pins, and the apertures are configured to establish a predetermined constant impedance connection between the mother test board and the daughter test board.

The stacked test board apparatus of the invention is cost-effective since it allows a single mother test board to be used with a variety of daughter test boards, where each daughter test board is configured for testing a different number of electronic devices. The apparatus provides this functionality while preserving a predetermined constant impedance between the test boards.

BRIEF DESCRIPTION OF THE DRAWINGS

For a better understanding of the nature and objects of the invention, reference should be made to the following detailed description taken in conjunction with the accompanying drawings, in which.

Like reference numerals refer to corresponding parts throughout the several views of the drawings.

DETAILED DESCRIPTION OF THE INVENTION

Figure 1:
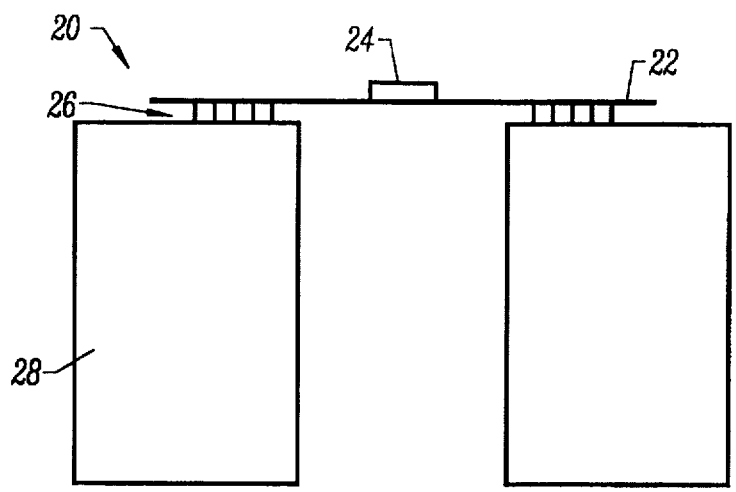
FIG. 1 illustrates electronic device test equipment in accordance with the prior art.
Figure 2:
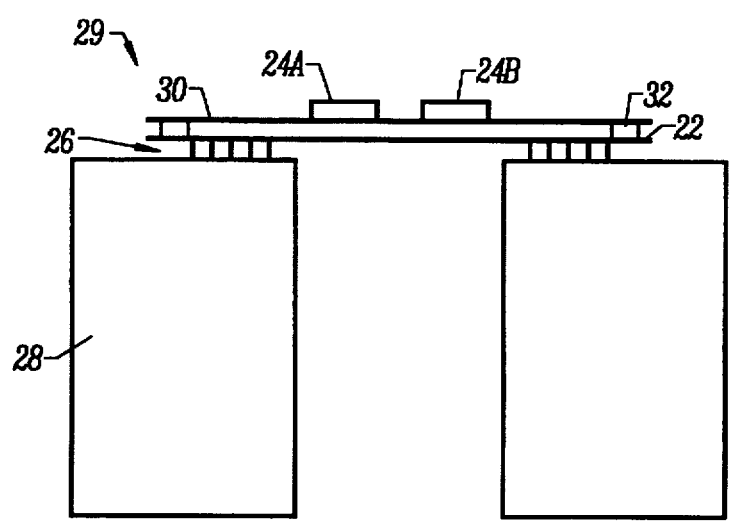
FIG. 2 illustrates a stacked test board apparatus in accordance with an embodiment of the invention.

FIG. 2 illustrates electronic device test equipment 29 in accordance with an embodiment of the invention. The equipment 29 includes a mother test board 22, pins 26, and an electronic test card 28. The electronic test card 28 is connected to additional electronic device test equipment (not shown). In accordance with the invention, a daughter test board 30 is positioned on top of an impedance matching structure 32, which is positioned on the mother test board 22. As will be shown below, electronic pins from the daughter test board 30 mate with electronic pins from the mother test board 22. In particular, the two sets of pins mate in apertures formed in the impedance matching structure 32. The configuration of the two sets of pins and the impedance matching structure provides a predetermined constant impedance between the mother test board and the daughter test board. As a result, effectively, a single test board is used from an electrical standpoint.

FIG. 2 illustrates that the daughter test board 30 holds two electronic devices 24A and 24B. Additional daughter test boards may be designed to hold more than two electronic devices. Thus, in accordance with the invention, a single mother test board 22 may be used in connection with a variety of daughter test boards 30. This interchangeability reduces cost, since daughter test boards 30 are less expensive than mother test boards 22, which require complex connections to the electronic test cards 28. The invention provides constant impedance between the two boards, thus the electrical performance of the test equipment is not compromised.

Figure 3:
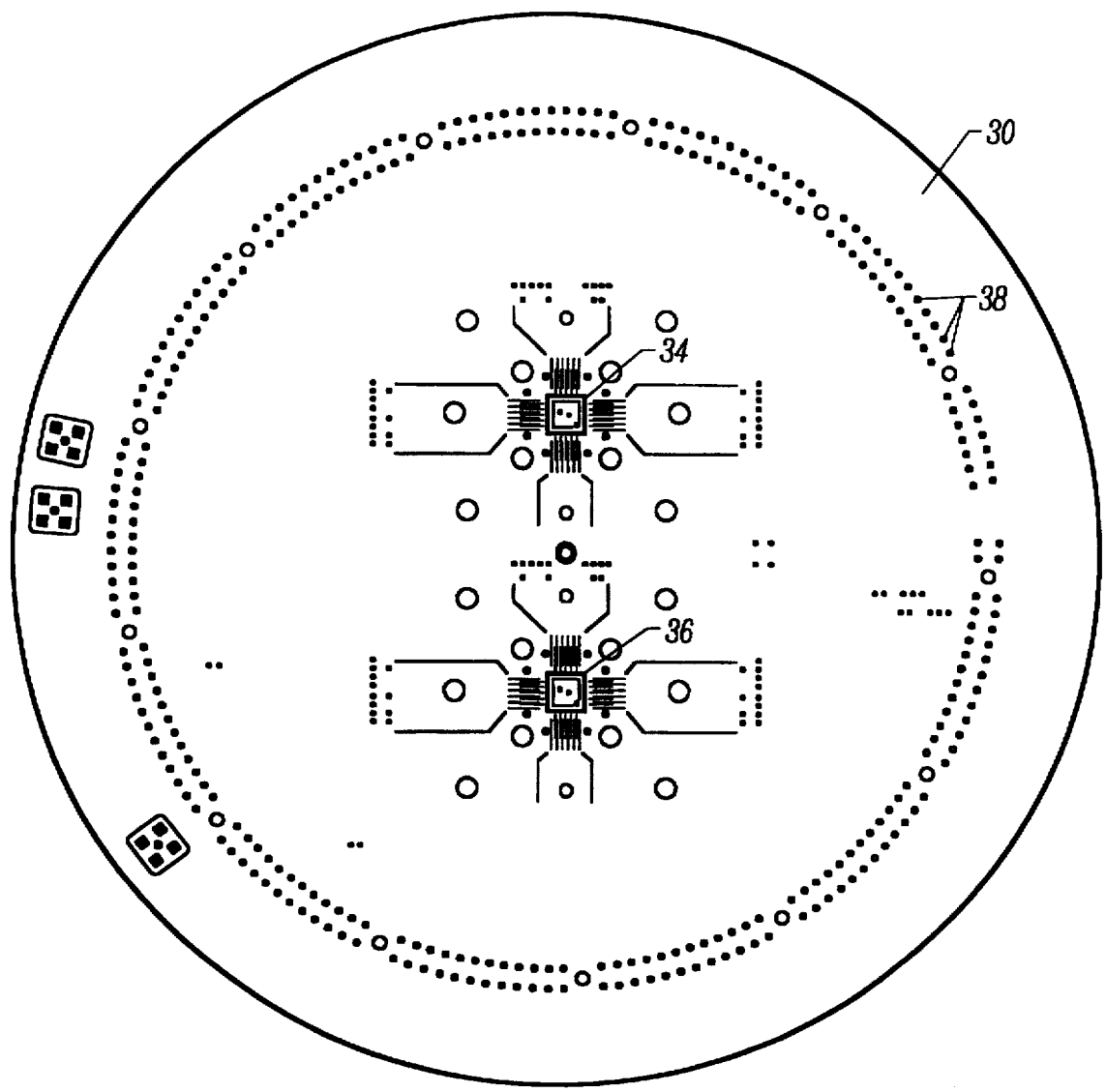
FIG. 3 is a top view of a daughter test board that may be used in accordance with an embodiment of the invention.

FIG. 3 is a top view of a daughter test board 30 in accordance with an embodiment of the invention. The daughter test board 30 includes a first device socket 34 to receive a first electronic device (not shown) and a second device socket 36 to receive a second electronic device (not shown). FIG. 3 also illustrates a set of perimeter pins 38, which are flush with the daughter board top surface. Electrical connections (not shown) exist between the device sockets 34 and 36 and the perimeter pins 38.

Figure 4:
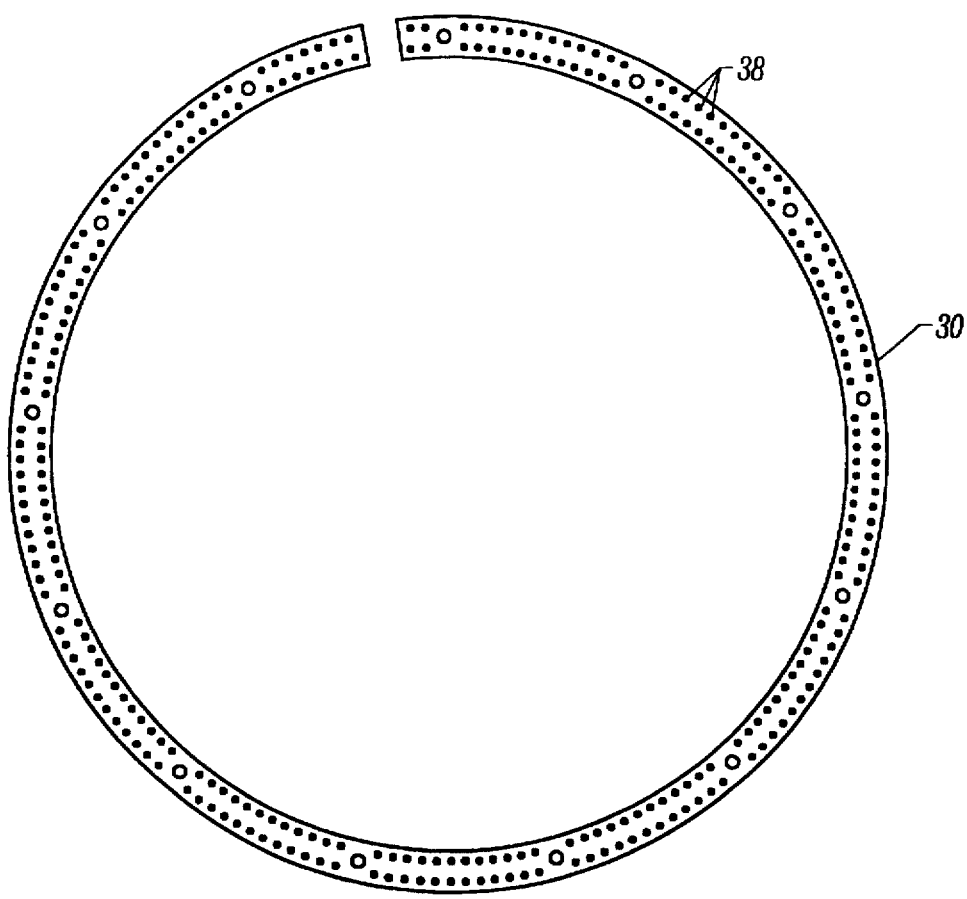
FIG. 4 is a bottom view of the pin interface portion of a daughter test board that may be used in accordance with an embodiment of the invention.

FIG. 4 is a bottom view of the pin interface portion of the daughter test board 30. In particular, FIG. 4 illustrates the perimeter pins 38 corresponding to the perimeter pins shown in FIG. 3. The perimeter pins 38 extend from the bottom side of the daughter test board 30. It should be noted that the top side of the mother test board 22 will have the same perimeter pin configuration as that shown in FIG. 3. That is, the top side of the mother test board 22 has extending perimeter pins that positionally mate with the pins of the daughter test board 30, as will be described below.

Figure 5:
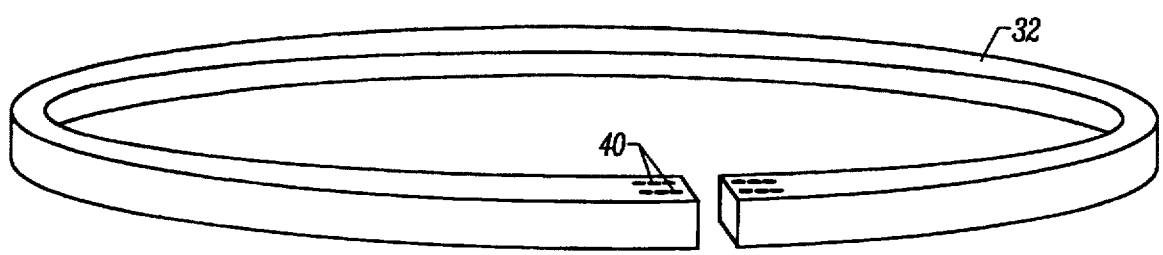
FIG. 5 is a perspective view of an impedance matching structure in accordance with an embodiment of the invention.

FIG. 5 is a perspective view of an impedance matching structure 32 in accordance with an embodiment of the invention. The impedance matching structure 32 includes impedance structure apertures 40. The impedance structure apertures 40 exist around the entire body of the impedance matching structure 32, although only a small number of apertures 40 are shown in FIG. 5. The impedance structure apertures 40 are positioned to correspond to the pins of the mother test board 22 and the daughter test board 30.

Figure 6:
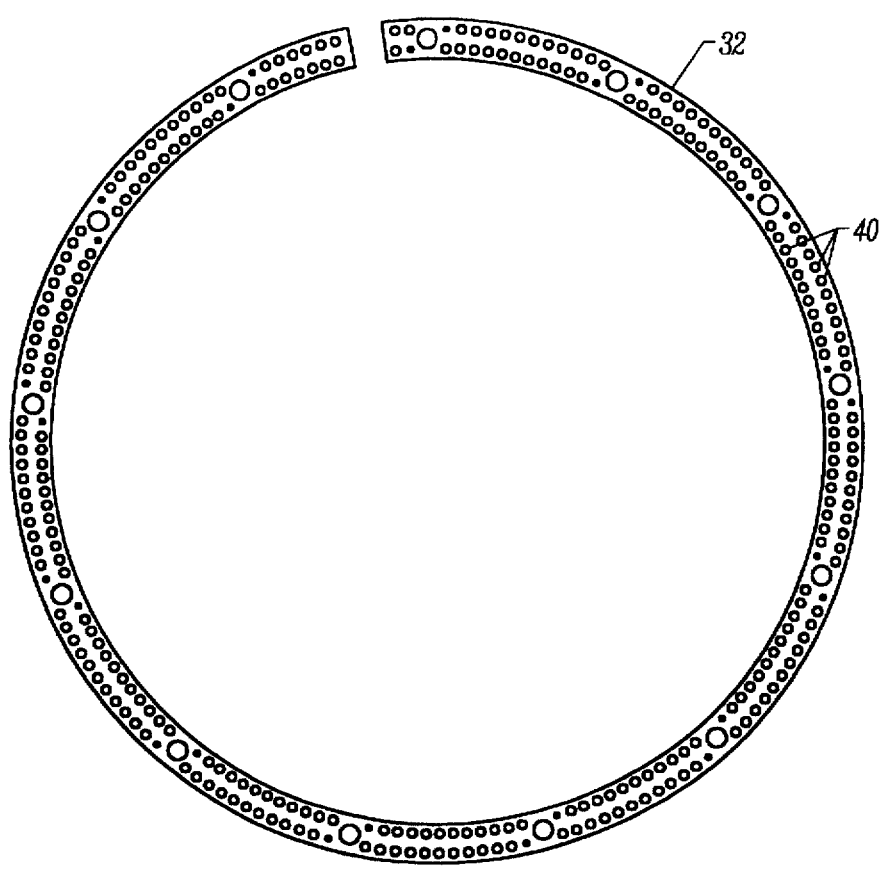
FIG. 6 is a top view of an impedance matching structure in accordance with an embodiment of the invention.

FIG. 6 is a top view of the impedance matching structure 32. FIG. 6 illustrates impedance structure apertures 40 that positionally correspond to the locations of the pins of the mother test board 22 and the daughter test board 30.

Figure 7:
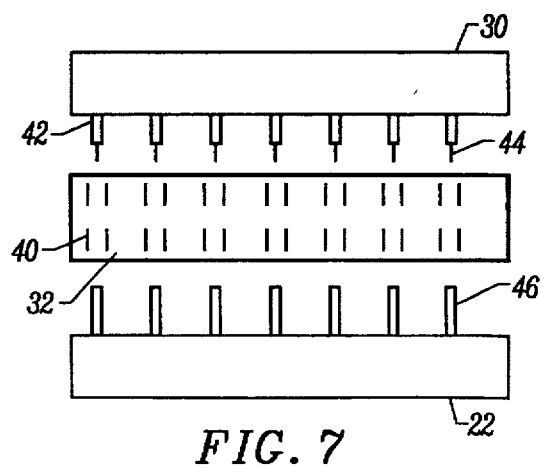
FIG. 7 is a side exploded view of the stacked test board apparatus of an embodiment of the invention.
Figure 8:
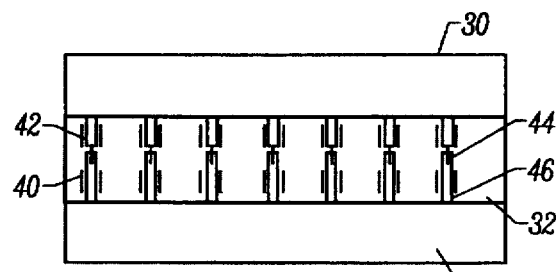
FIG. 8 is a side view of the stacked test board apparatus of an embodiment of the invention.

FIG. 7 is an exploded side view of a portion of the stacked test board apparatus of the invention. In particular, the figure shows the impedance matching structure 32 positioned between the mother test board 22 and the daughter test board 30. Dashed lines are used to illustrates the impedance structure apertures 40. The figure also illustrates daughter board pins 42. In this embodiment of the invention, each daughter board pin 42 includes a narrow extending member 44 for mating with the pins 46 of the mother board 22. FIG. 8 illustrates the components of FIG. 7 in a connected configuration.

Figure 9:
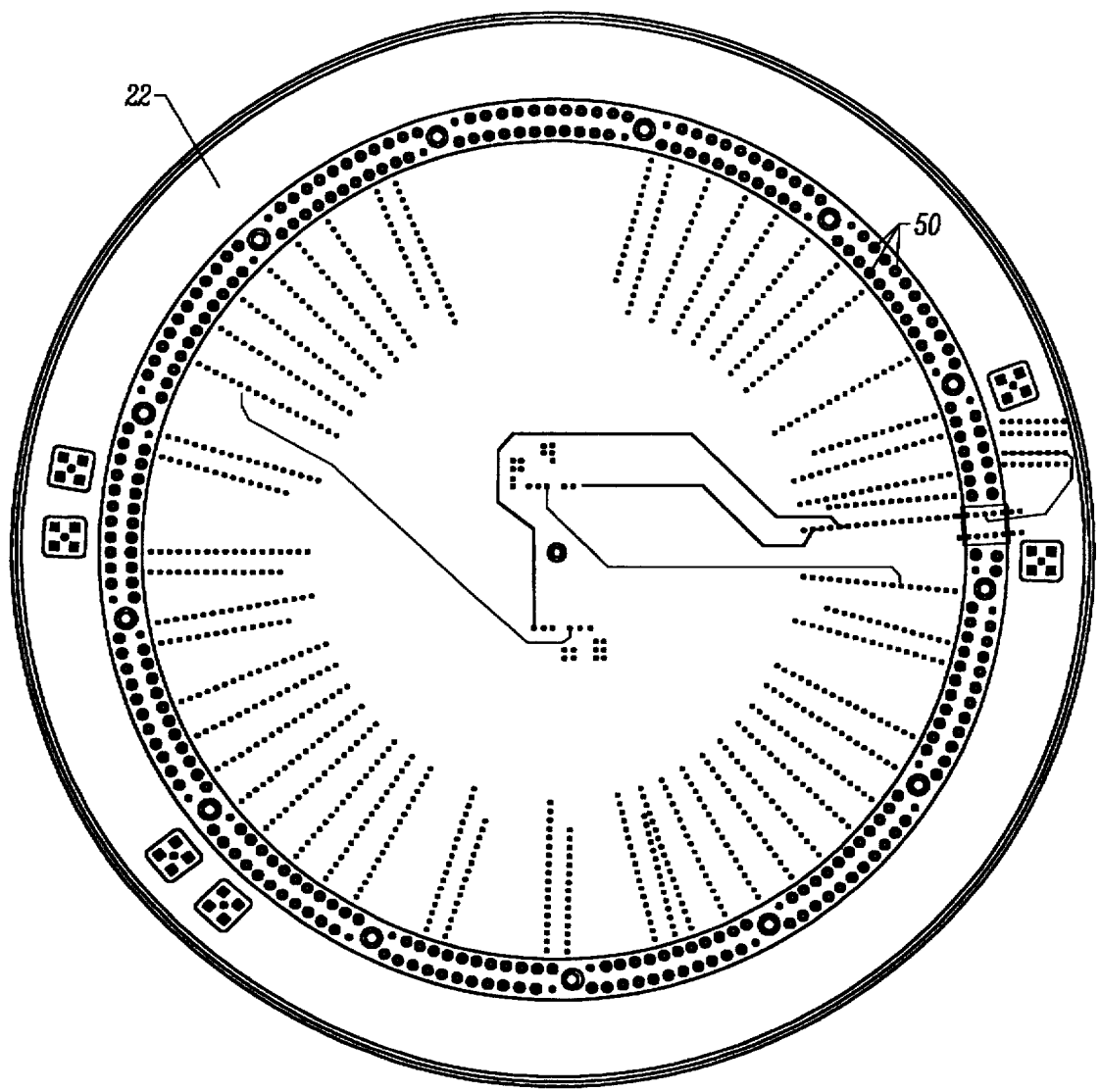
FIG. 9 is a top view of a mother test board that may be used in accordance with an embodiment of the invention.

FIG. 9 is a top view of the mother test board 22. The board 22 includes perimeter pins 50 positionally corresponding to the previously described pins. The perimeter pins 50 are electrically connected to pin arrays 60, which are electrically connected to pin electronic cards (not shown) on the opposite side of the board 22.

An embodiment of the invention was constructed to achieve a 50 Ohm constant impedance. In this configuration, the impedance matching structure 32 was formed of gold plated aluminum. Each impedance structure aperture 40 is machined and has a diameter of between 0.10 and 0.20 inches, preferably a diameter between 0.130 and 0.150 inches, and most preferably a diameter of approximately 0.140 inches. Each aperture 40 is insulated on its perimeter with a dielectric such as plastic, ceramic, or air. The pins extending from the bottom of the daughter board have a diameter of between 0.05 and 0.07 inches, preferably a diameter between 0.055 and 0.060 inches, and most preferably a diameter of approximately 0.058 inches. The extending member 44 of the pins has a diameter of between 0.020 and 0.025 inches, preferably a diameter between 0.022 and 0.024 inches, and most preferably a diameter of approximately 0.023 inches. The pins have a length between 0.15 and 0.23 inches, preferably a length between 0.20 and 0.23 inches, and most preferably a length of approximately 0.23 inches.

The pins extending from the top of the mother board have a diameter of between 0.05 and 0.07 inches, preferably a diameter between 0.055 and 0.060 inches, and most preferably a diameter of approximately 0.058 inches. The pins have a length between 0.15 and 0.19 inches, preferably a length between 0.18 and 0.19 inches, and most preferably a length of approximately 0.187 inches.

The pins are preferably formed of gold-plated nickel. They may also be formed of gold-plated aluminum. The pins have also been implemented using Hypertac™ Contact Pins sold by I.E.H. Brooklyn, N.Y.

The impedance matching structure 32 is grounded. The perimeter pins of the daughter board 30 and the mother board 22 are preferably surrounded by a copper ring. Each perimeter pin is insulated from the copper ring by the insulating substance of the board itself. Thus, the impedance matching structure and copper rings are at the same electrical potential.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following Claims and their equivalents.

I claim:

1. An apparatus for use with electronic device test equipment, comprising:

a mother test board with a top surface with a first set of pins extending therefrom, and a bottom surface for connection to a plurality of pin electronic cards of electronic device test equipment;

a daughter test board with a top surface with a connection mechanism to receive an electronic device, and a bottom surface with a second set of pins extending therefrom; and an impedance matching structure positioned between said mother test board and said daughter test board, said impedance matching structure defining a plurality of apertures positionally aligned with said first set of pins and said second set of pins such that said first set of pins and said second set of pins physically mate within said apertures, said first set of pins, said second set of pins, and said apertures being configured to establish a predetermined constant impedance connection between said mother test board and said daughter test board.

2. The apparatus of claim 1 wherein said daughter test board includes a plurality of connection mechanisms to receive a corresponding plurality of electronic devices.

3. The apparatus of claim 1 wherein said predetermined constant impedance is 50 Ohms.

4. The apparatus of claim 3 wherein said impedance matching structure is shaped in a ring.

5. The apparatus of claim 4 wherein said impedance matching structure is formed of gold plated aluminum.

6. The apparatus of claim 3 wherein said plurality of apertures include apertures with a diameter of between 0.10 and 0.20 inches.

7. The apparatus of claim 3 wherein said first set of pins of said mother test board include pins with a diameter of between 0.05 and 0.07 inches.

8. The apparatus of claim 3 wherein said first set of pins of said mother test board include pins with a length between 0.15 and 0.19 inches.

9. The apparatus of claim 3 wherein said second set of pins of said daughter test board include pins with a diameter of between 0.05 and 0.07 inches.

10. The apparatus of claim 9 wherein said second set of pins of said daughter test board include pins with extending members, with each extending member having a length of between 0.15 and 0.23 inches.

11. The apparatus of claim 1 wherein said first set of pins and said second set of pins are formed from a material selected from the group including gold-plated nickel and gold-plated aluminum.

* * * * *